United States Patent [19]
Dai et al.

[11] Patent Number: 5,345,456
[45] Date of Patent: Sep. 6, 1994

[54] SPATIALLY ADDRESSABLE SURFACE EMISSION SUM FREQUENCY DEVICE

[75] Inventors: Hongxing Dai, Gloucester; Siegfried Janz, Ottawa; Michel M. Dion, Gloucester; Richard Normandin, Ottawa, all of Canada

[73] Assignee: National Research Council of Canada, Ottawa, Canada

[21] Appl. No.: 29,584

[22] Filed: Mar. 11, 1993

[51] Int. Cl.$^5$ .............................................. H01S 3/10
[52] U.S. Cl. .......................................... 372/22; 372/50;
372/45; 372/21; 359/328; 385/131
[58] Field of Search .................... 372/50, 45, 20, 21,
372/22, 6, 96; 359/328, 326; 385/129, 130, 131

[56] References Cited

U.S. PATENT DOCUMENTS

| | | | |
|---|---|---|---|
| 5,051,617 | 9/1991 | Normandin et al. | 359/328 |
| 5,103,456 | 4/1992 | Scifres et al. | 372/50 |
| 5,111,466 | 5/1992 | Normandin et al. | 372/22 |
| 5,241,413 | 8/1993 | Uenishi et al. | 372/22 |

Primary Examiner—Georgia Y. Epps

[57] ABSTRACT

An active surface-emitting harmonic generator based on a multilayer $Al_xGa_{1-x}As$ non linear waveguide integrated monlithically with a tunable InGaAs single quantum well laser is provided. Controlling the difference in frequency between a signal provided by the tunable laser and another input optical signal allows an output signal to be directed to any of a plurality of directions in space. Positioning detectors near the monolithic device allows spatial addressing. The controllable monolithic device may also be used to scan and thus to read data stored on holographic media.

20 Claims, 17 Drawing Sheets

SPATIALLY ADDRESSABLE SURFACE EMISSION SUM FREQUENCY DEVICE

FIELD OF THE INVENTION

The present invention relates to semiconductor laser sources. More specifically, it is directed to multi-layered sum frequency waveguide device and spatially addressable systems.

BACKGROUND OF THE INVENTION

In Optics Letters, Vol. 4 No. 2 February 1979, pp. 58–59, R. Normandin (the present inventor) et al, reported the non-linear mixing of oppositely propagating guided waves. The resultant field was coupled to radiation modes and propagated in a direction perpendicular to the waveguide surface, in the case of equal frequency fundamentals. In subsequent articles, its application to picosecond signal processing, the creation of all optical transient digitizers and spectrometers demonstrated the potential usefulness of this work. (See Appl. Phys. Lett. 36 (4), Feb. 15, 1980, pp. 253–255 by R. Normandin et al; 40 (9), 1982, pp. 759–761 by R. Normandin et al, and "Integrated Optical Circuits and Components" edited by L. D. Hutcheson, Dekker Inc., New York, U.S.A., Chapter 9, by G. I. Stegeman et al.) The overlap of the two oppositely propagating fields will give rise to a nonlinear polarization source at the sum frequency. In bulk media such a process is nonradiative due to the simultaneous requirement of energy and momentum conservation in all directions. This is not the case in a waveguide geometry.

Unfortunately, since the waves do not grow with distance, (no phase matching) the resultant fields are much weaker than that obtained in a traditional second harmonic generation device. Therefore, this nonlinear interaction has remained largely a laboratory curiosity. However in U.S. Pat. No. 5,051,617, entitled Multilayer Semiconductor Waveguide Device for Sum Frequency Generation From Contra-Propagating Beams, the present inventor has increased this interaction by factors of $10^7$ to obtain efficient conversion in the visible region. Thus, with the invention disclosed in U.S. Pat. No. 5,051,617, ultra fast subpicosecond samplers and monolithic high resolution spectrometers are possible in the context of fiber optic communication systems and optoelectronic integrated circuitry. Although the invention disclosed in U.S. Pat. No. 5,051,617 adequately performs it's intended function, there is a requirement for a device which will allow a sum frequency output wave to be directed in any one of a plurality positions in a plane in space in a controlled manner.

When two guided fundamental wavelengths are identical, oppositely propagating and traveling in the same collinear and one dimensional path, the radiated harmonic signal is observed in a direction perpendicular to the surface of the waveguide. When the two oppositely propagating optical signals are of differing wavelength, wave vector addition rules coupled with energy conservation rules dictate the angle of emission as well as the sum harmonic wavelength.

U.S. Pat. No. 5,111,466 in the name of the Normandin (the applicant) et al. issued May 5, 1992 and entitled "Optical Multilayer Structures for Harmonic Laser Emission", discloses that two counter-propagating lights which are contained in an optical waveguide along a single dimension can interact and form a second harmonic optical signal which is emitted from the optical waveguide in a direction different from the single dimension, and thus can be detected outside the waveguide. The disclosed waveguide is formed of layers of semiconductor material having different indices of refraction. The thicknesses of the layers and their periodicity determine the bandwidth and relative wavelengths of the two input signals determine the angles of emission of the harmonic signal. In FIG. 9 of the drawings, it is shown that if the two counter-propagating optical signals are mixed in a non-linear waveguide, and one of those signals has a fixed frequency, the angle of emission of the output signal will change as the frequency of the other optical signal varies. If plural multiplexed optical signals having different frequencies were each selectively combined with a counter-propagating reference signal having a fixed frequency in the optical waveguide, the output signal of each combined pair would have a differing angle of emission. Normandin et al. disclose that with several fixed detectors in the far field, multichannel detection can be reconfigured at will by switching the reference beams and adjusting them in frequency to direct each channel on the desired detector position. Although directing each channel to a desired detector position in this manner may be useful, it would be more advantageous to have additional control allowing any input channel to be directed to any one of a plurality of far field detectors. For instance, this would be useful in the field of telecommunications where one channel could be connected to any of a plurality of other channels.

This invention is thus relevant to spatially addressable coherent detectors, optical data storage and retrieval systems, fiber optical communication systems and optoelectronic communication systems, to name a few.

OBJECTS OF THE INVENTION

It is an object of the invention to provide a device for controlling the direction in a space of an output optical signal.

SUMMARY OF THE INVENTION

In accordance with an aspect of the invention a monolithic integrated circuit for generating an output optical signal in any of a plurality of directions in space comprising: controllable coherent light injection means for generating a coherent signal, the frequency of the coherent signal being adjustable in dependence upon the magnitude of a controlling parameter; and non-linear waveguide means for generating the output optical signal in response to an other optical signal and to the coherent signal contra-propagating within the waveguide, the direction of the output optical signal being dependent upon the frequency difference between the coherent signal and the other optical signal.

In accordance with the invention there is further provided, a monolithic integrated circuit comprising a multilayer waveguide wherein each adjacent layer of the multilayer waveguide has different linear and nonlinear optical properties; and, a separate confined single quantum well heterostructure embedded in the multilayer waveguide for providing gain of an optical signal.

In accordance with another aspect of the invention, there is provided, a spatially addressable coherent detection system comprising: a monolithic integrated circuit for generating an output optical signal in any of a plurality of directions in space, the integrated circuit including controllable coherent light injection means for generating a coherent signal, the frequency of the coherent signal being adjustable in dependence upon the magnitude of a controlling parameter, and including non-linear waveguide means for generating the output optical signal in response to an other optical signal and to the coherent signal contra-propagating within the waveguide, the direction of the output optical signal being dependent upon the frequency difference between the coherent signal and the other optical signal; and, means for detecting the output optical signal.

In accordance with another aspect of the invention there is provided, a method of propagating an optical signal in a plurality of dimensions/directions in space, comprising the steps of: a) directing a coherent light-signal and an other contra-propagating optical signal into a non-linear waveguide means for generating an output optical signal, the direction of the output optical signal being determined by the frequency difference between the coherent light-signal and the other optical signal; and, b) varying the difference in frequency between the coherent light-signal and the input optical signal and repeating step (a).

In accordance with another aspect of the invention, in a non-linear waveguide having an on-board integrated tunable laser for generating a coherent light signal, there is provided, a method of propagating an optical signal in a plurality of directions in space comprising the steps of: a) directing an other contra-propagating optical signal into a non-linear waveguide means for generating an output optical signal, the direction of the output optical signal being determined by the frequency difference between the coherent light-signal and the other optical signal; and, b) varying the frequency of the coherent light-signal.

The monolithic circuit can be designed to operate in dependence upon any one of a plurality of controlling parameters such as current, voltage, temperature or light, to provide a means for directing a signal in any one of a plurality of directions in space.

BRIEF DESCRIPTION OF THE DRAWINGS

Exemplary embodiments of the invention will be described in accordance with the drawings in which.

DETAILED DESCRIPTION OF THE DRAWINGS

Figure 1:
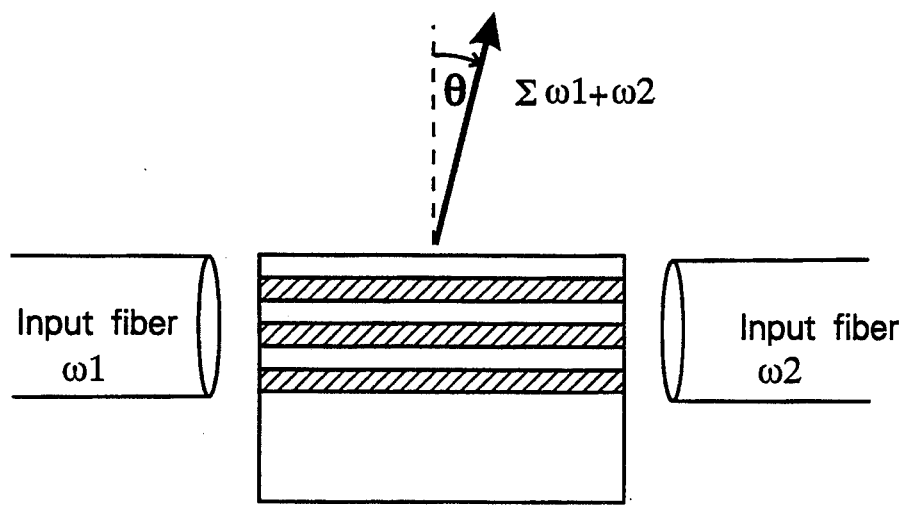
FIG. 1 is a an isometric view of a block diagram of a non-linear waveguide.

Referring to FIG. 1, a non-linear optical waveguide is shown illustrating the concept of variance of angle of emission as the difference in frequencies of two input signals changes. A first signal having a frequency $\omega_1$ is launched in a waveguide which is formed of plural layers of optically non-linear semiconductor materials, the first optical signal being applied in a first direction which is parallel to the layers. A second optical signal of frequency $\omega_2$ is applied to the waveguide in a second direction is parallel to the layers but opposite in direction to the first signal. When the frequency of the two signals is the same, that is when $\omega_1 = \omega_2$, the angle of emission $\theta = 0$. As the difference in frequency between $\omega_1$ and $\omega_2$ increases, the angle $\theta$ also increases. The third signal having a frequency $\omega_1 + \omega_2$ propagates in a direction corresponding to an angle of emission $\theta$ from the normal line. Thus, the surface emitting harmonic generator (SEHG) waveguide is often referred to as a sum frequency generator (SFG).

Figure 2:
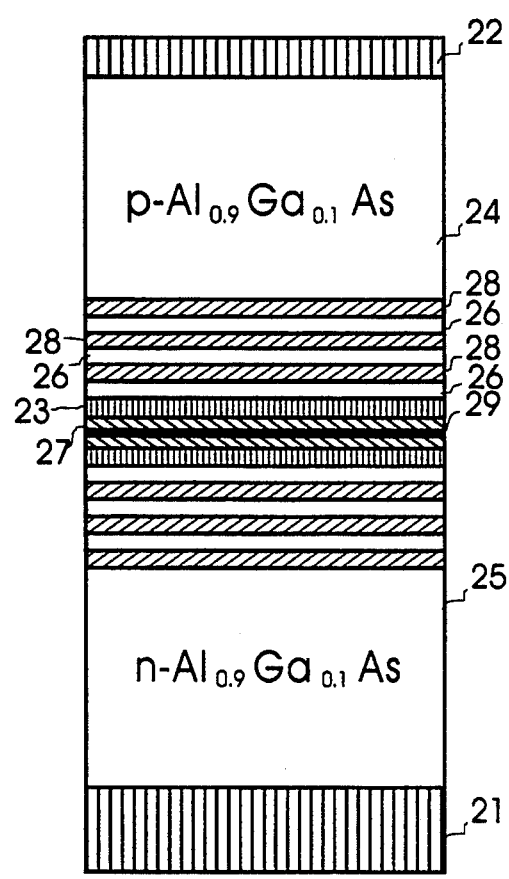
FIG. 2 is a cross sectional view of a monolithic integrated surface emitting harmonic generator (SEHG) and laser in accordance with the invention.

One concern when integrating an SFG with a semiconductor laser into a monolithic device is increased cavity loss introduced by the modal interruption and the interband absorption from the passive waveguide region. As a result of increased losses, the integrated laser may exhibit high threshold current and low light output power. Therefore, in designing an active SEHG structure, it is important to have an efficient SFG while not severely affecting the performance of the laser. In FIG. 2 a layered structure representing an SEHG including a laser generating means is shown. The layer profile comprises a grated index, separate-confinement heterostructure (GRINSCH) of $In_{0.2}Ga_{0.8}As$ single quantum well 29 and a GaAs confinement layer 27 and a grated confinement layer 23 varying between GaAs and $Al_{0.9}Ga_{0.1}As$ embedded in the multilayer non-linear waveguide comprising alternating layers 26 and 28. The thickness of each layer of the mulit-layer non-linear waveguide corresponds to the halfwave optical path length at the sum frequency light wavelength. High aluminum contents of a cladding layer 24 are preferable to reduce absorption loss of the sum-frequency light. In order to preserve the phase matching condition for the SFG and to achieve efficient lasing operation it is preferable for the effective thickness of the GRINSCH region to be three times the halfwave path length of GaAs. Top and bottom 24 and 25 cladding layers are doped with beryllium (p-type) and silicon (n-type), respectively, with a dopant concentration of $5 \times 10^{17}$ $cm^{-3}$. A thin cap layer 22 of p+GaAs is used to assist in the formation of the electrical contact of the tunable laser. The core of the waveguide including the multilayer and the gain region is kept undoped in order to optimize the SFG process.

The integrated active SEHG/laser structure is grown on an (100) oriented n+-GaAs substrate 21 using solid source molecular beam epitaxy (MBE) in a VG80H machine. R. L. Williams, M. Dion, F. Chatenoud and K. Dzurko, in Appl. Phys. Lett. 58, 1816 (1991) have summarized growth procedures including the substrate temperature sequence. Standard photolithographic processing procedures are used to process the wafer into fully active and segmented cavity lasers. For fully active lasers, both broad-area and ridge waveguide devices are fabricated. By wet chemical etching along [011] direction to a depth of ~1.3 μm from the wafer surface a 5 μm wide ridge waveguide is created for the lateral optical confinement. The area outside of the ridge top is covered by $SiO_2$ insulating layer for the confinement of injection current. For both broad area and ridge lasers, a uniform Ti/Pt/Au metal layer is evaporated on the front surface (p+-GaAs) to form an ohmic contact. For the segmented lasers, active/passive segments are created by depositing Ti/Pt/Au mesh electrodes with 150 μm metal separated by 150 μm bare semiconductor on the front surface. Wet chemical etching is applied to the uncovered area to remove the p+-GaAs cap and most of the p-$Al_{0.9}Ga_{0.1}As$ cladding layer (~0.9 μm) to allow low loss windows for the radiation of sum-frequency light. For all the three types of devices, vertical grooves are etched along the [011] direction resulting in 260 μm wide laser bars. The backside (n+-GaAs) of these devices is thinned to a thickness of ~100 μm and metalized with uniform Ni/Ge/Au to form n-type contact. Devices with various cavity lengths and uncoated mirror facets were made by cleaving along the <011> planes.

Test Results

Figure 3A:
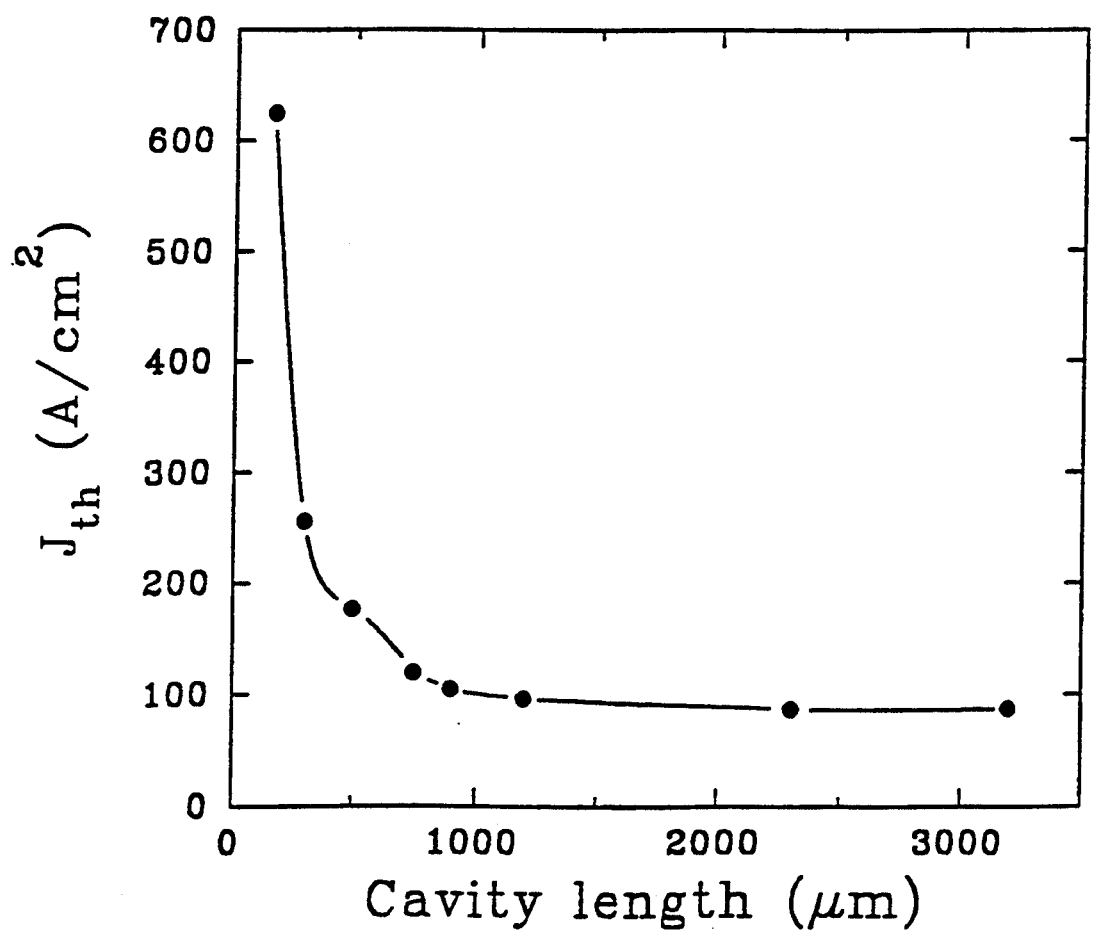
FIG. 3a is a graph illustrating the variation of threshold current density $J_{th}$ with the cavity length L of a broad area laser.
Figure 3B:
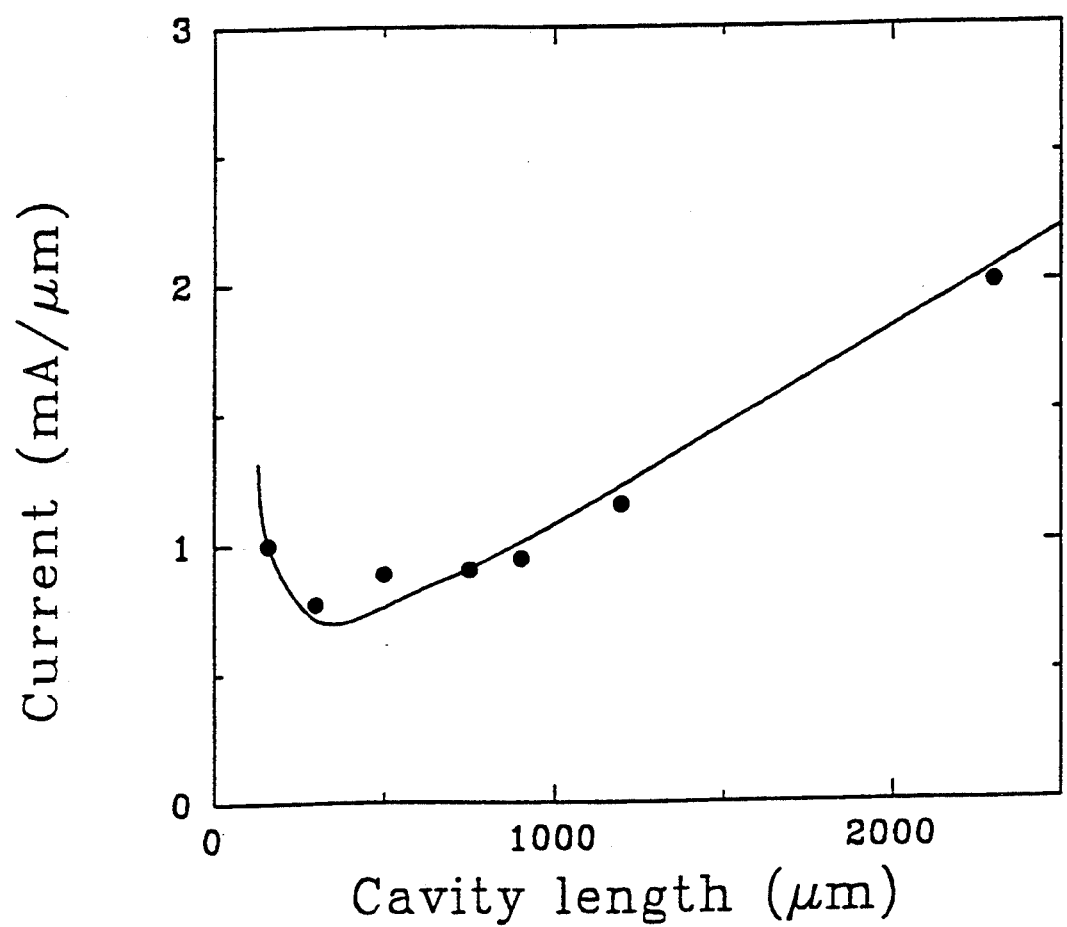
FIG. 3b is a graph illustrating the threshold current normalized to ridge width as a function of cavity length.

Tests were performed and conducted at room temperature and without any device heat sinking. The $\mathcal{L}$-I characteristics were measured using 200 ns current pulses at 10 kHz. Light output measurements were made using a calibrated InGaAs PIN diode. In FIG. 3 the variation of threshold current density $J_{th}$ with the cavity length L of the broad area lasers is shown. The value of $J_{th}$ decreases rapidly from ~625 $A/cm^2$ for L=160 μm to below 100 $A/cm^2$ for L>1000 μm along with the increasing cavity length. The monotonic decrease of the threshold current density with increasing cavity length represents the diminishing effect of mirror losses relative to the distributed waveguide losses. The minimum value of $J_{th}$ obtained for this material is ~87.5 $A/cm^2$ at L=3.3 mm. This value is somewhat higher than the state-of-art result observed in InGaAs/AlGaAs SQW lasers but is expected since some extra losses may be caused by the multilayer inhomogeneity in the integrated material structure. The threshold current normalized to ridge width as a function of cavity length ($I_{th}$~L) is shown in FIG. 3(b). It exhibits a characteristic $I_{th}$~L variation seen in typical SQW lasers. The minimum of ~1.3 mA occurring around L=300 μm gives an indication as to the threshold currents that should be possible in narrow stripe buried heterostucture (BH) lasers. For the ridge lasers, the minimum threshold current was found to be ~8 mA which is slightly higher than the predicted value in FIG. 3(b). This discrepancy indicates that some injection current leakage may exist outside of the ridge area possibly caused by some over-etching when the insulating $SiO_2$ layer was opened for making the electrode contact. Moreover, circular modes and amplified spontaneous emission (ASE) may also contribute to the high threshold current observed.

Figure 4:
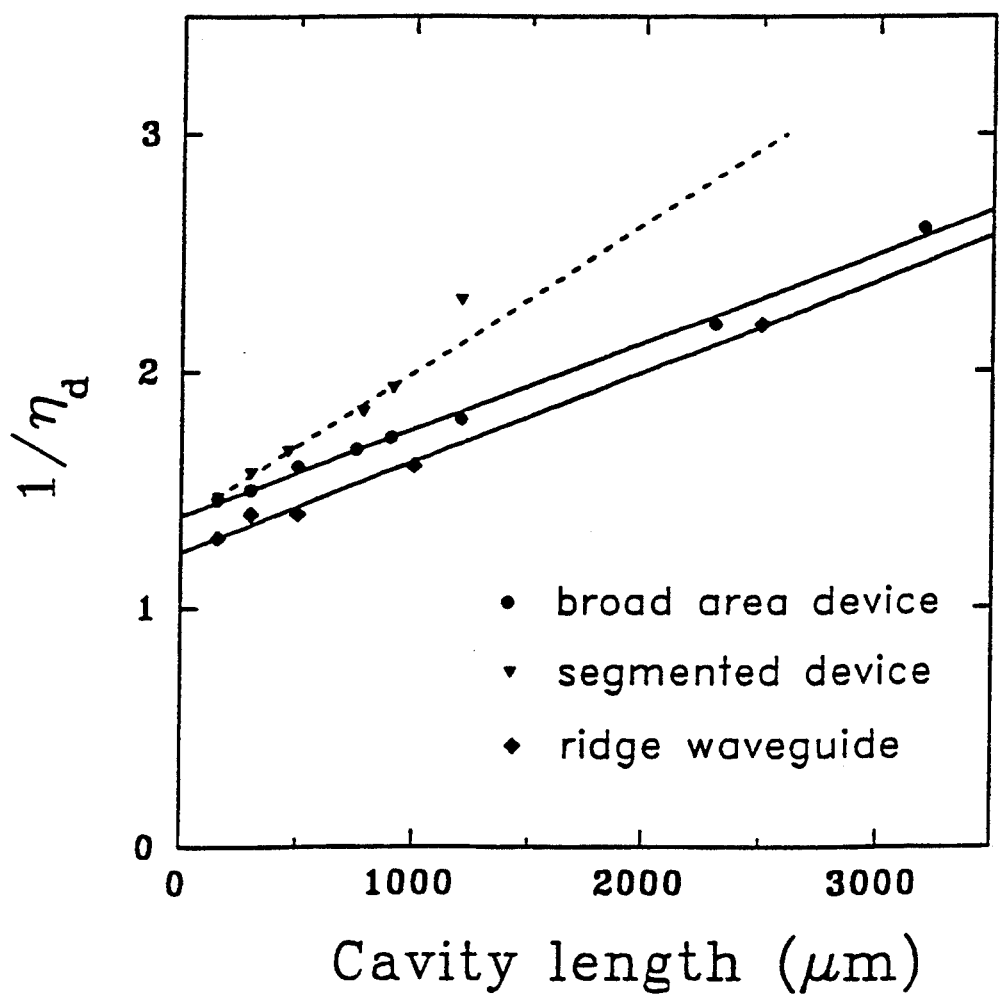
FIG. 4 is a graph illustrating the relation between the differential external quantum efficiency, $\eta_d$, extracted from the $\mathcal{L}$-I measurements, and the laser cavity length.

The relation between the differential external quantum efficiency, $\eta_d$, extracted from the $\mathcal{L}$-I measurements, and the laser cavity length is shown in FIG. 4 for both broad and ridge waveguide lasers. Also included in FIG. 4 are the data from segmented lasers with only one segment (150 μm) pumped. The reciprocal of the external quantum efficiency increases linearly with increasing cavity length as observed in typical semiconductor lasers. Extrapolation towards L=0 reveals the internal quantum efficiency $\eta_i$ to be ~71% for the broad-area lasers and ~80% for the ridge lasers. The higher $\eta_i$ value observed for the ridge lasers is probably due to the higher injection levels required for these lasers which leads to a net increase in the ratio of radiative and nonradiative recombination rates. The waveguide loss determined from the slope of $1/\eta_d$ versus L line is between 3 and 3.2 $cm^{-1}$ which is relatively low and consistent with the good wafer morphology of the epitaxial structure. However, an internal quantum efficiency of ~80% suggests that there are still improvements in epitaxial growth and device performance that can be made. For the segmented lasers, the measured value of $1/\eta_d$ deviates from linearity with increasing cavity length. An approximate linear fit (the dashed line in FIG. 4) indicates a total loss greater than 5 $cm^{-1}$ for these devices. Several factors may contribute to the increased losses. It is believed that the extra loss is partially caused by the interband resonant loss within the unpumped region. This effect can be quite substantial since the passive segments acts as intracavity saturable absorbers in the current device geometry. Thermal instability can be a contributing factor for higher loss as well. It was observed that the performance of the segmented cavity devices deteriorates quickly at high injection currents which is believed to be caused by the high series resistance (~5.5 Ω) in the current materials. Moreover, small modal scattering loss may be introduced at the active/passive interface.

Cavity Length Dependence Of Lasing Wavelength

Figure 5:
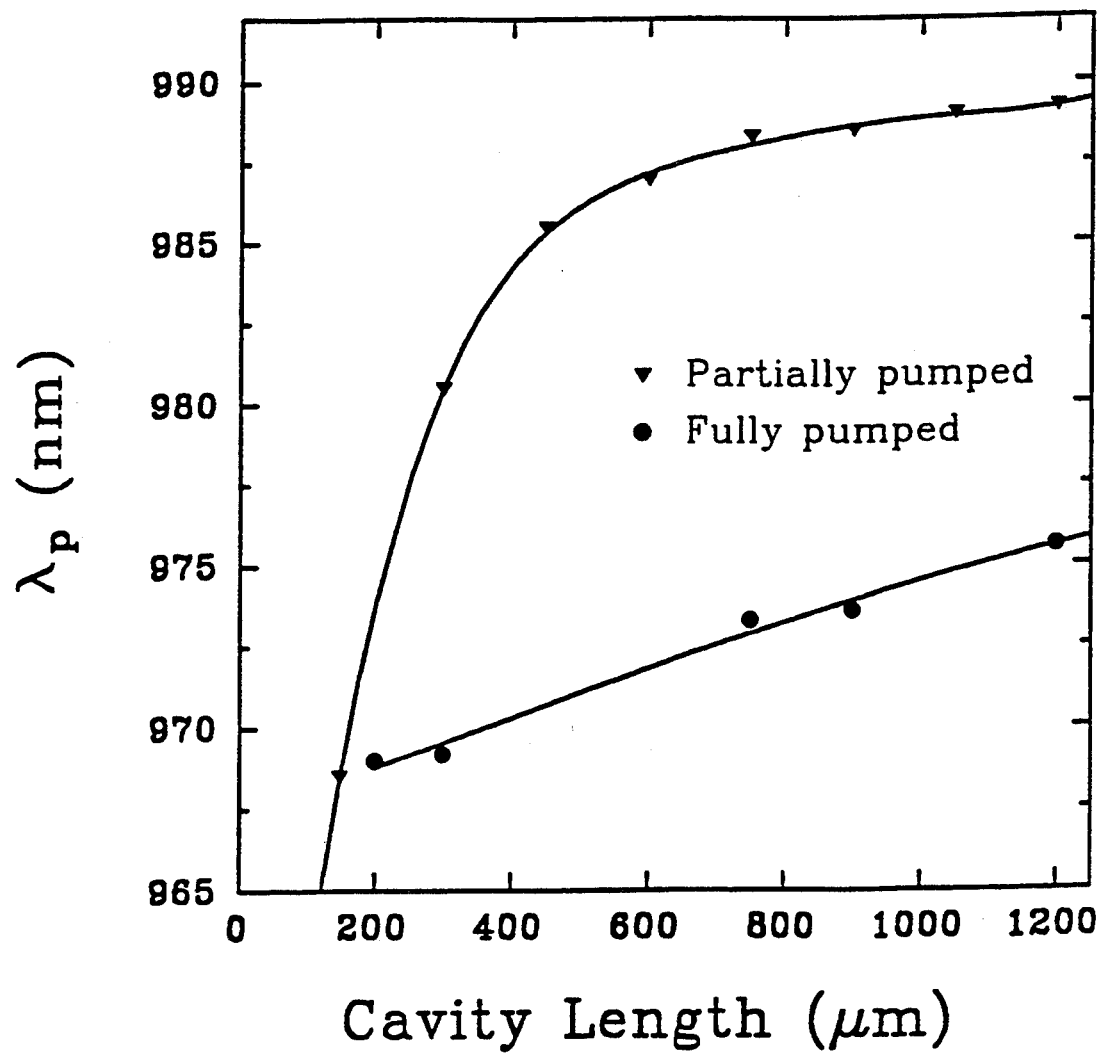
FIG. 5 is a graph plotting the dependence of peak lasing wavelength $\lambda_p$ versus the cavity length.

Lasing spectra for both fully pumped broad area lasers and partially pumped segmented lasers of various cavity lengths were measured with a ½ meter spectrometer equipped with a 1200 line/mm grating. The dependence of peak lasing wavelength $\lambda_p$ on the cavity length is shown in FIG. 5. For both types of devices, $\mu_p$ tends to shift towards longer wavelengths with increasing cavity length whereas the later shows a much faster increasing rate at short cavity length resulting in a total red shift of ~20 nm. The wavelength variation with cavity length is a well known phenomenon in quantum well (QW) lasers. In the fully active cavity, the lasing wavelength is determined by the separation between the quasi-Fermi levels of the conduction and valence bands, which in turn depend on the carrier density, or equivalently, the injection current density, $J_{th}$, at threshold. Since $J_{th}$ scales roughly as $(1/L)\ln(1/R)$ with respect to the cavity length L as indicated by FIG. 3a, a red shift in lasing wavelength follows. In the case of partially pumped cavity lasers, however, the large red shift at short cavity length is believed to be caused by the wavelength dependent resonant absorption loss in the passive segment. Since the unpumped segment is an intracavity absorber which contains the same SQW as the pumped active segment, the resonant absorption loss increases rapidly in the wavelength range where the gain spectrum of the pumped segment attains its peak. As a result, the effective gain spectrum of the segmented cavity peaks at a longer wavelength, where the effect due to resonant loss in the passive segment is reduced. The lasing wavelength, therefore, is expected to be red shifted after introducing the passive segment in the cavity. It is worth noting that this wavelength variation behavior has also been observed in similar segmented lasers without the nonlinear integrated multilayer waveguide.

Sum-Frequency Power and SFG Efficiency

Figure 6:
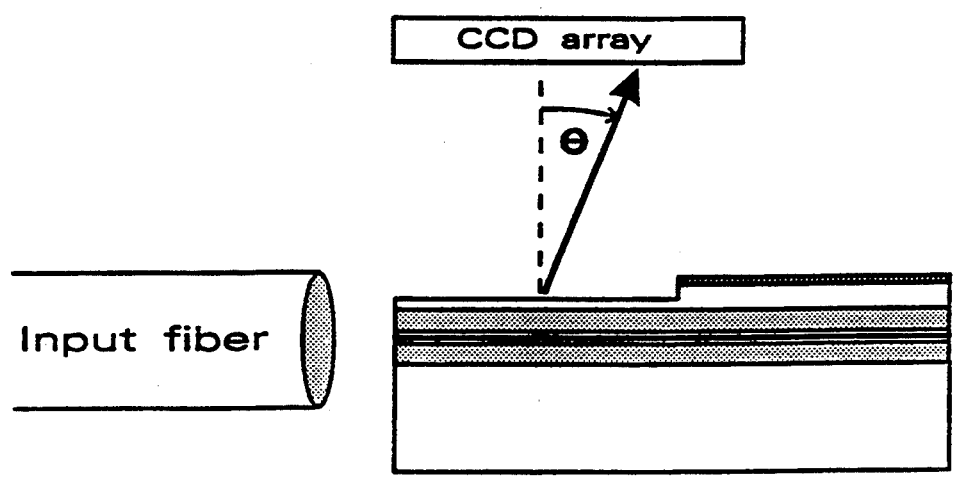
FIG. 6 is a pictorial view of an input fiber having an end coupled with integrated device shown in cross section.

The surface-emitting SFG process was investigated on a device with a 300 μm long active/passive cavity. A Q-switched CVI Nd:YAG laser oscillating at 1.06 μm was used as one of the two counter propagating light waves to interact with the integrated InGaAs/GaAs SQW laser mode inside the cavity. The Nd:YAG laser output, operated in synchronization with the laser diode current pulse, was end coupled into the integrated device from the passive end via a single mode fiber of 6 μm core diameter as shown in FIG. 6. Although both transverse electric (TE) and transverse magnetic (TM) waveguide modes are excited by the Nd:YAG signal input, only the TM component will be useful in the current device. This is because the (100) substrate orientation of the device geometry requires a TE-TM cross mixing in the fundamental fields to generate the surface-emitting harmonic light. The InGaAs SQW laser normally exhibits a predominant TE mode oscillation which, consequently, interacts only with the TM mode of the oppositely propagating wave.

Figure 7:
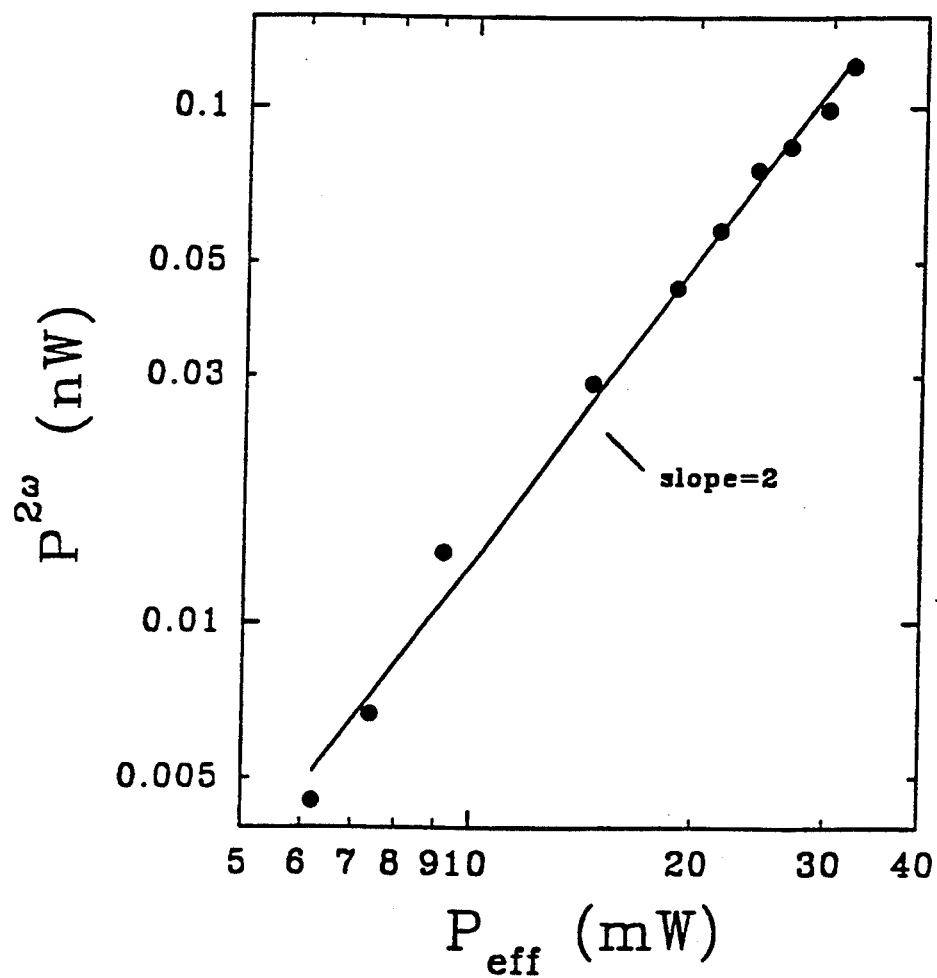
FIG. 7 is a graph illustrating the measured sum-frequency light power versus the effective fundamental power in the waveguide.

The average power of the Nd:YAG 1.06 μm light in the guide was estimated to be ~1 mW. The power of SQW laser was varied by varying the injection current. The 0.51 μm sum-frequency green light power emitting from the SEHG surface was measured using a calibrated CCD detector array. Of course, this array of detectors can be integrated monolithically onto the same chip as the waveguide. Shown in FIG. 7 is the measured sum-frequency light power versus the effective fundamental power in the waveguide. The effective fundamental power was estimated according to the formula $$P_{eff} = \sqrt{P_{Nd:YAG} \cdot P_{diode}} \tag{1}$$

with $P_{Nd:YAG}$ and $P_{diode}$ the effective power carried by the TM and TE waveguide modes respectively. Clearly FIG. 7 indicates a square-law dependence between harmonic and fundamental power, consistent with the nature of a second order nonlinear process. A maximum sum-frequency light power of ~0.1 nW was obtained. This power level is limited by the small emission area (~15×150 μm²) and the somewhat moderate fundamental power from the integrated SQW laser without heat sinking. With the addition of heat sinking and a high reflection coating on one of the cavity facets, a higher SFG power can be expected. The sum-frequency light was found to be deflected from the waveguide surface normal by approximately 8 degrees. This deflection results from the simultaneous requirements of the energy and momentum conservation during the nonlinear SFG processes. Note that this deflection angle is quite close to the theoretical value of 8.125 degrees predicted by the equation [2]

$$\sin\theta = \frac{(\beta_1 - \beta_2)c}{\omega_1 + \omega_2} \tag{2}$$

where $\beta_1$, $\beta_2$, $\omega_1$ and $\omega_2$ are the propagation constant and angular frequency of each fundamental mode.

The sum-frequency field intensity emitted along the waveguide surface normal (y-axis) is given by $$<S_{av}> = \tag{3}$$

$$\frac{1}{2} Re(E_{top} \times H_{top}^*) = \frac{1}{2} \omega^2 \sqrt{\frac{\mu_o}{\epsilon_o}} \left(\frac{n^{2\omega}}{n^{2\omega} + 1}\right)^2 SS^*\hat{y}$$

with $$S = \int_{-\infty}^{0} \frac{p(y')}{n(y')} \exp\left[-ik_0 \int_{-y'}^{0} n(y'')dy''\right] dy' \tag{4}$$

taking phase into account. $P^{nl}(y)$ in Eq. (4) is the sum-frequency polarization induced by the nonlinear mixing of the counter propagating waveguide modes. For experimental purposes, it is convenient to characterize the SFG efficiency in terms of nonlinear interaction cross section defined by $$P^{2\omega} = A^{nl} P^2_{eff} \tag{5}$$

with an equivalent radiation area of 1 mm by 1 cm for the sum-frequency light assumed for normalization. The $A^{nl}$ inferred from the data in FIG. 6 for this device is $~2\times 10^{-7}$ W$^{-1}$. This value is typical for an AlGaAs multilayer waveguide and agrees well with the theoretical prediction using Eqs. (3) and (4) for similar structures. Green harmonic light along the direction of the waveguide surface normal was also observed. Since the output intensity was not affected by changing the SQW laser power level, it was believed to be the second harmonic light produced by nonlinear interaction between the TE and TM modes excited by the Nd:YAG laser, where the counter propagating guided waves were provided by the 30% reflection of the end cleaved facets. Moreover, no surface emitted harmonic signal was detected when the Nd:YAG laser was turned off, which indicates that the SQW laser diode was indeed oscillating in a TE transverse mode as expected. Finally, the polarization for the sum-frequency and second-harmonic light was found to be linearly polarized perpendicular to the propagation direction of the fundamental waveguide modes as determined by the crystal orientation of device cavity.

According to Eq. (2), the sum-frequency light deflection angle from surface normal of a SEHG is related to the wavelength difference of the two counter propagating light waves. Assuming that $\beta_1$ is the fixed propagation constant of the onboard SQW laser mode for an active SEHG, and that $\beta_2$ represents the propagation constant of modes belonging to a multi-wavelength WDM signal source coupled into the device, the sum-frequency light corresponding to each signal wavelength will radiate at a different angle and reach different detector elements, resulting in effective wavelength division demultiplexing. The application of the integrated laser/SEHG device as WDM demultiplexors was demonstrated by coupling a Ti:Sapphire tunable laser light into the 300 $\mu$m long active/passive cavity, as shown in FIG. 6, to simulate the multichannel signal source. A CCD detector array equipped with a cylindrical imaging lens was used as the detector for surface emitted sum-frequency light. By sweeping over roughly 15 nm near the 1 $\mu$m wavelength region, the radiation angle of the sum-frequency light was found varying from 0.3 to 1.6 degrees as shown in FIG. 7. The solid line represents the deflection angle calculated using Eq. (2) with the appropriate propagation constants. As shown in the FIG., the angle measurement are in excellent agreement with theory.

Figure 8:
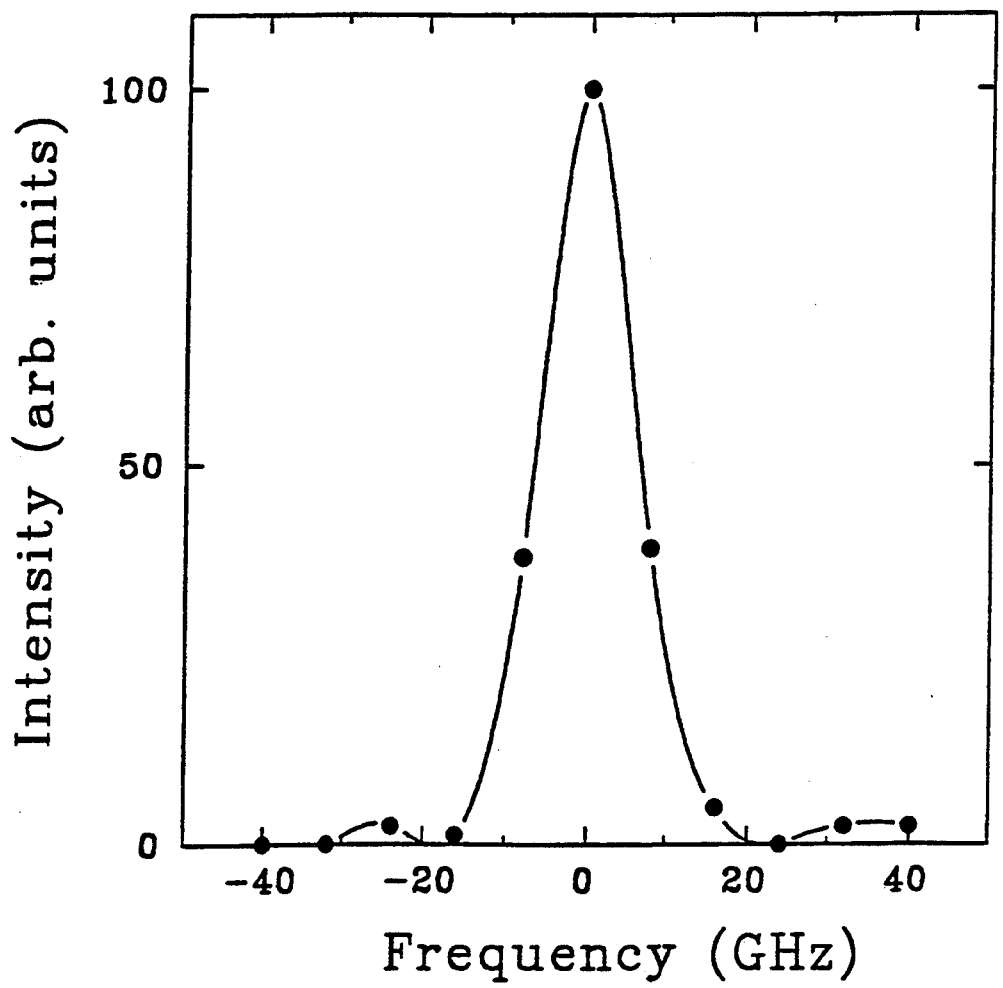
FIG. 8 is a graph of the angular spreading of the sum-frequency light measured on a passive SEHG with a 10 mm long emission area when coupled with counter propagating 1.06 μm light, plotting intensity versus frequency.
Figure 9:
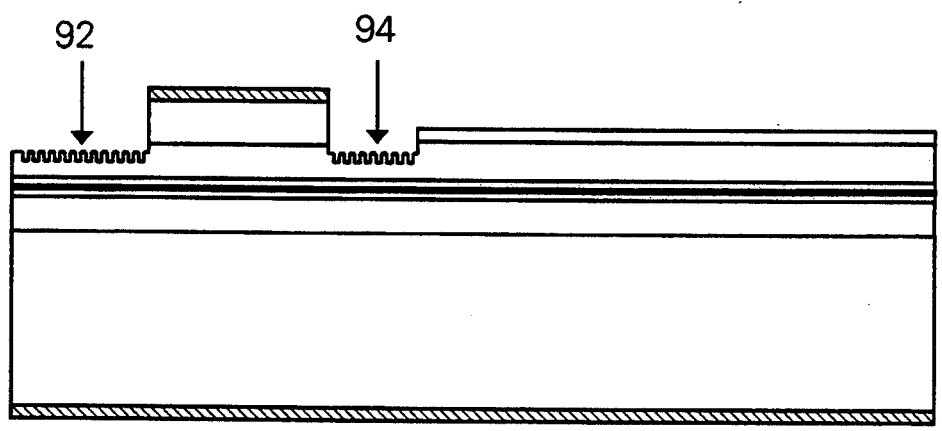
FIG. 9 is a cross sectional side view of a surface emitting harmonic generator and laser where both the totally reflective and partially reflective distributed bragg reflectors are made of first order surface gratings to provide a narrow line width reference source for the high resolution applications.

One of the key parameters for WDM demultiplexers is the minimum channel separation without crosstalk. In the devices considered here, it is essentially governed by the diffraction limit of the surface-emitting segment length. According to Rayleigh's criteria $$\lambda/\Delta\lambda \approx nL/\lambda \qquad (4)$$

the estimated spectral resolution for the 300 $\mu$m long active/passive segmented devices is <2 nm at ~1 $\mu$m wavelength region. This resolution limit was confirmed by the measured spot size of the sum-frequency light at far field. By lengthening the SEHG segment, higher resolution can be achieved. Shown in FIG. 8 is the angular spreading of the sum-frequency light measured on a passive SEHG with a 10 mm long emission area when coupled with counter propagating 1.06 $\mu$m light. It is quite obvious that a resolution <15 GHz is possible. An integrated device consisting of a 10 mm long SEHG and a distributed-bragg-reflector (DBR) laser is presently under investigation for high resolution spectrometer and WDM applications. The proposed geometry is shown in FIG. 9 where both the totally reflective and partially reflective DBRs 92 and 94 respectively are made of first order surface gratings to provide a narrow linewidth reference source for the high resolution applications.

Spatially Addressable Coherent Detector

Figure 10:
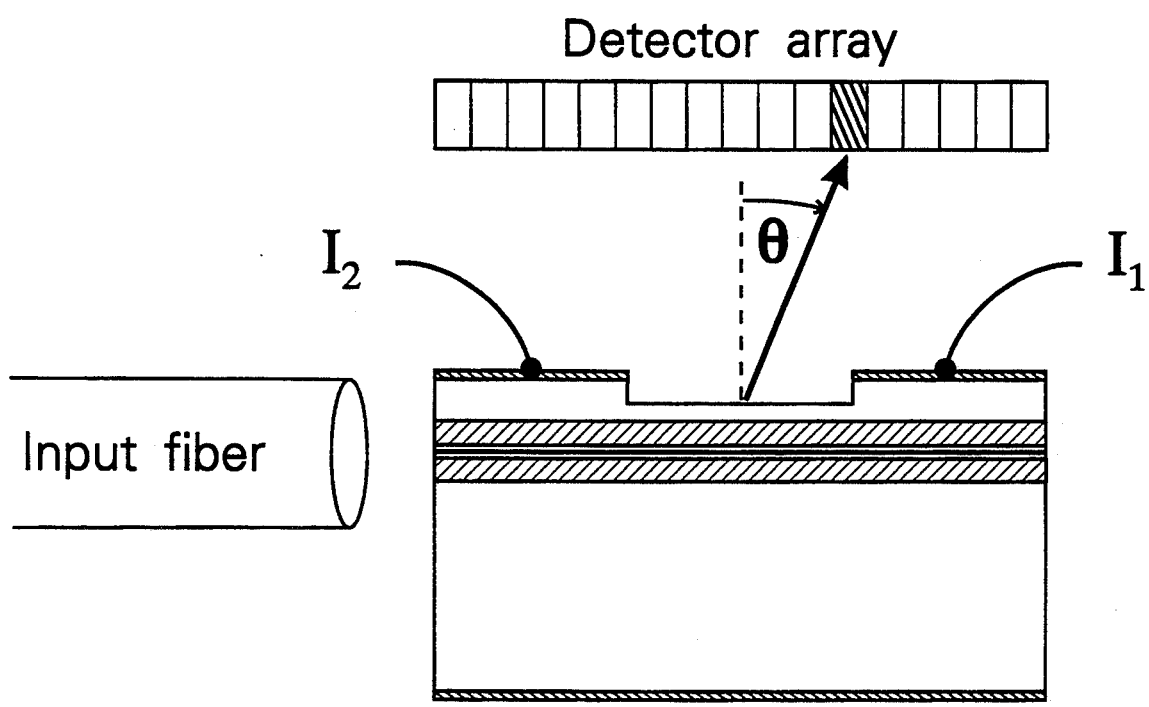
FIG. 10 is a pictorial view illustrating the wavelength tuning feature of the integrated laser offering the possibility to direct the sum-frequency light output into detectors at the predefined positions.
Figure 11:
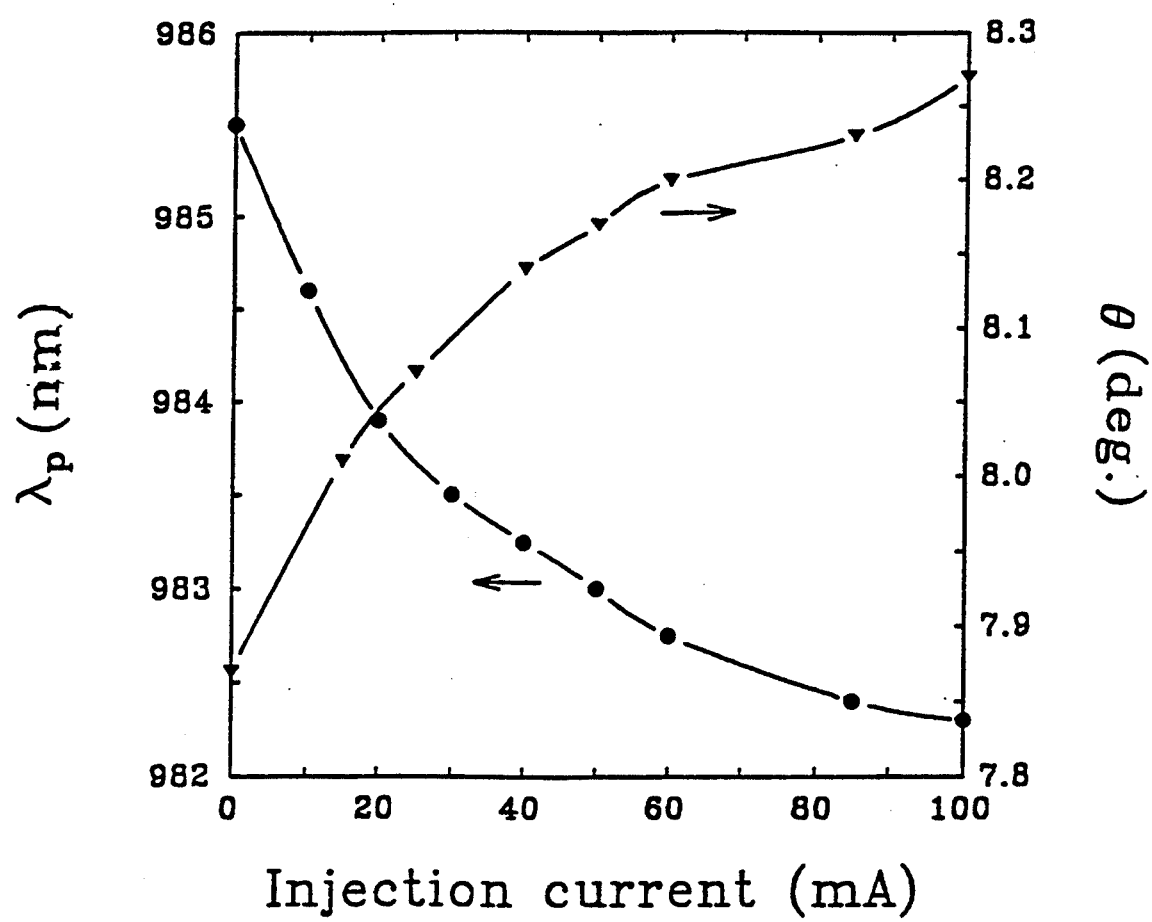
FIG. 11 is a graph of the measured wavelength and sum-frequency deflection angle as a function of injection current into the second electrode.
Figure 12:
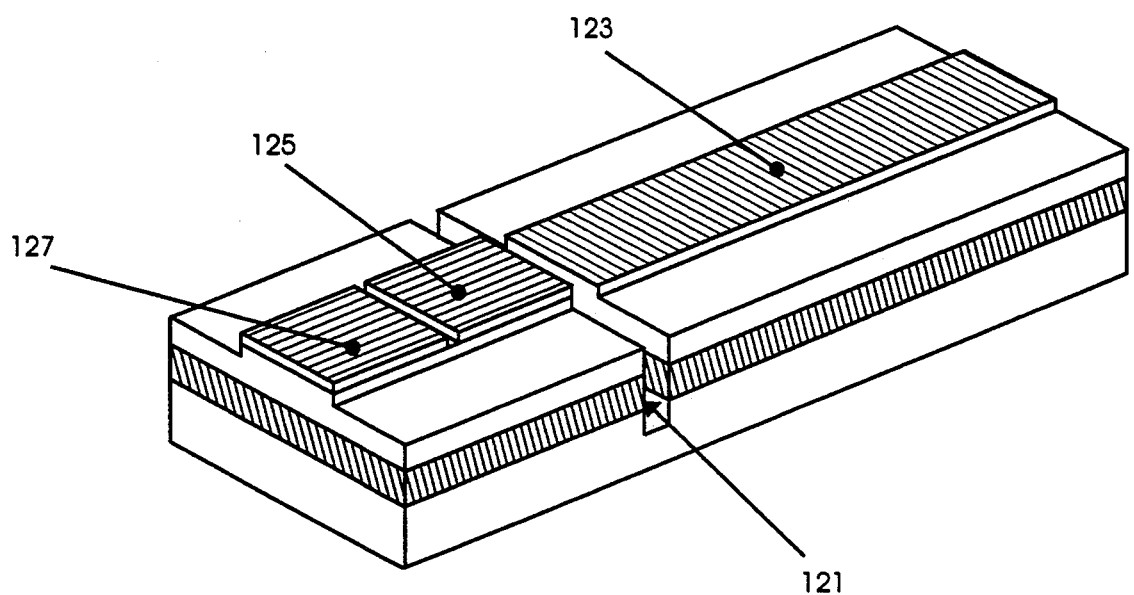
FIG. 12 is an oblique view of an active tuning laser cavity shown separated from the surface emitting harmonic generator segment by FIB milled facets.
Figure 13:
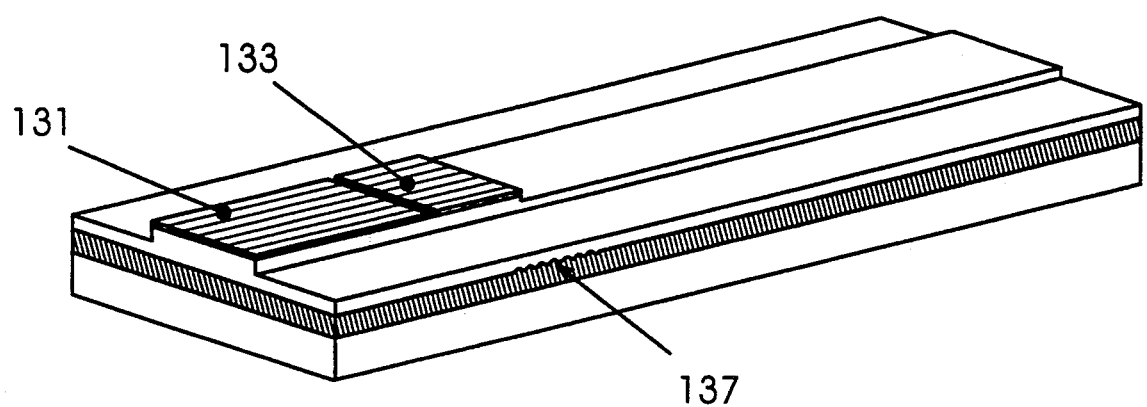
FIG. 13 is an oblique view of an active tuning laser having distributed feedback means in the form of a DBR.

As described above, the red shift in lasing wavelength in a segmented device is mainly caused by the wavelength dependent resonant absorption loss in a passive segment. If this loss can be changed in a controlled fashion, wavelength tuning in the segmented device is thus possible. This can be realized in a multiple electrode device. When current is injected into the previously unpumped section resulting in reduced resonant absorption loss, lasing wavelength is expected to shift towards the blue. The wavelength tuning feature of the integrated laser offers the possibility to direct the sum-frequency light output into detectors at the predefined positions. This concept was demonstrated on a double-active-segment device by coupling an 1.06 $\mu$m light into the cavity as the input signal shown in FIG. 10. While keeping the current injection of the electrodes at above threshold, the injection of the second is varied between 0 to 100 mA. The sum-frequency light output at far field was monitored using the same CCD detector array mentioned previously. Of course, it is also possible to tune the laser by controlling several other parameters; for instance a change in temperature will affect the frequency of the optical signal produced by the laser. In FIG. 11 the measured wavelength and sum-frequency deflection angle as a function of injection current into the second electrode is shown graphically. As expected, a wavelength decrease (blue shift) of about 30 Å was observed as $I_2$ was varied from 0 to 100 mA. Correspondingly, the deflection angle $\theta$ of the green sum-frequency light was changed by more than 0.4 degrees with increasing injection current at the second electrode. Noting that the phase information is preserved in the overall nonlinear interaction, this device can thus be used as a novel spatially addressable coherent detector by electrically tuning the onboard laser wavelength. According to the results in FIG. 5, much larger tuning range should be possible if the passive segment length can be reduced to nearly zero. This can be realized in a modified device geometry as shown in FIG. 12. Here the active/tuning laser cavity is separated from the SEHG segment 123 by FIB milled facets 121. Since the passive gap only serves for the purpose of electric isolation between the two electrodes, it can be relatively narrow which lends to much broader wavelength tuning. Metal contacts 127 and 125 function as gain and tuning control points. Alternatively, the FIB milled facets can be replaced with a partially reflecting distributed feedback reflector 137 as shown in FIG. 13. Two metal contacts 131 and 133 are shown for adjusting gain and tuning respectively. In this case the tuning is dependent upon the variation of the index of refraction within the distributed feedback grating.

Figure 14:
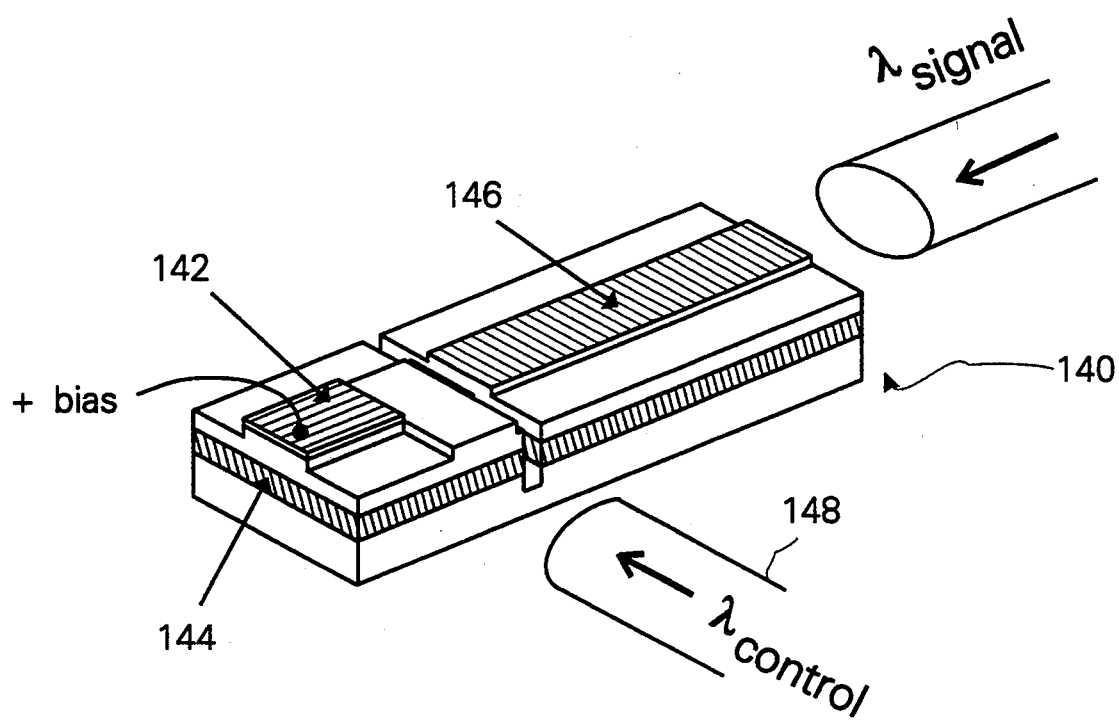
FIG. 14 is an oblique view of an active tuning laser shown being controlled with an optical control signal.

FIG. 14 shows means of wavelength control via an external optical port for receiving an optical signal. The integrated circuit 140 comprises an SEHG segment 146 and an active segment 142. The intensity of the received optical signal 148 changes the index of refraction of the controlled active segment 142 of the lasing cavity 144 and therefore the lasing signal frequency may be varied. In addition to the means described heretofore, the frequency of an optical signal generated by a laser may also be varied by changing the temperature of the laser cavity.

Figure 15:
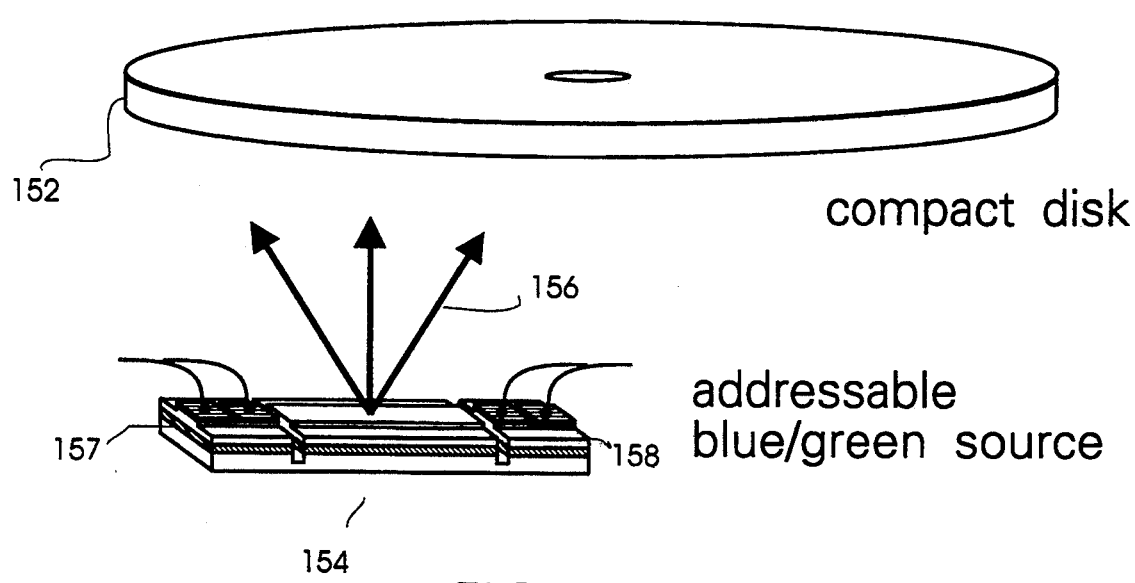
FIG. 15 is an oblique view of a monolithic integrated surface emitting harmonic generator (SEHG) and integrated laser for reading information stored on a compact disk; and, FIG. 16 is an oblique view of a monolithic SEHG and integrated laser having three input ports for receiving optical signals and having first and second detector arrays positioned in a first and second respective planes to detect output signals.

Referring to FIG. 15 an arrangement is shown wherein an integrated circuit 154 comprising an SEHG segment and an active segment are positioned to scan a compact disk 152. A first lasing cavity 157 of the integrated circuit 154 may be controlled by any of the means described heretofore to produce an output signal 156 which has a frequency which may be controlled and which may be directed in a plurality of directions. Another laser cavity 158 provides a reference signal for combining with the tunable signal generated by first lasing cavity. Since the frequency of the output signal is the sum of the frequency of the input signals, advantageously the output signal could be of a very high frequency in the blue/green spectrum allowing large amounts of data to be stored and read from a compact disk. Controlling the difference in the frequencies of two input signals, which may be generated on the integrated circuit 154 provides directional control of where the output signal will read on the compact disk 152. The arrangement shown in FIG. 15 obviates conventional means of moving a laser beam from one track to another on a compact disk, such as stepper motors and the like. Of course arrangements may be envisaged wherein the integrated circuit 154 is controlled to scan other holographic media.

Figure 16:
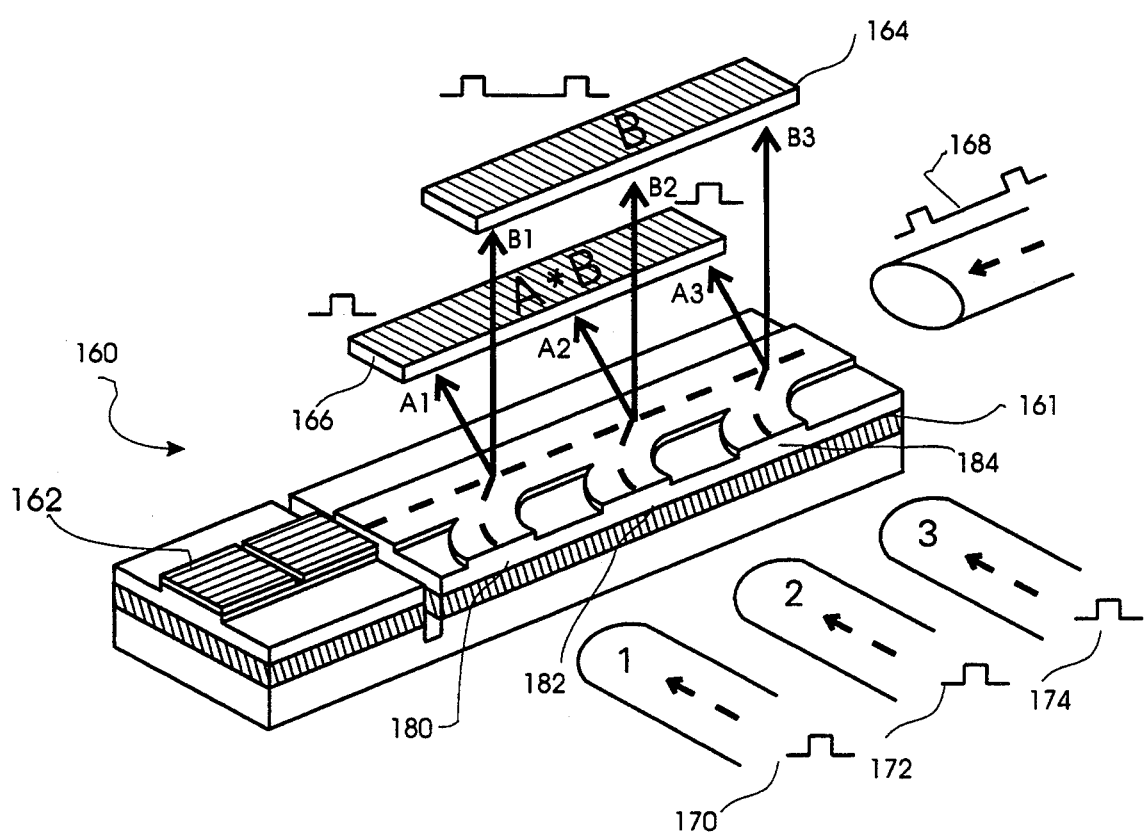

FIG. 16 shows means for transmitting and detecting an external serial data signal 168 in a plurality of locations and configurations. An integrated circuit 160 comprises an SEHG segment 161 and an active segment 162. The active segment 162 comprises a tunable laser which may be controlled by any means described heretofore. Optical ports 180, 182, and 184 are provided on a side of the integrated circuit 160 for receiving optical signals 170, 172, and 174 respectively. A first CCD detector array 164 is positioned to detect a first group of signals B1, B2, and B3. A second CCD detector array 166 is positioned to detect a second group of signals A1, A2, and A3. Both the first and second group of signals may be generated in a variety of ways. For example, in one mode of operation the four optical signals 170 to 176 may be triggered simultaneously as the serial data signal 168 comprised of data pulses propagates through the SEHG segment and are aligned with the optical ports 180 to 186. As three optical pulses of the serial signal 168 are presented to the three optical ports, a pulse of the first optical signal 170 mixes with a first pulse of the serial data signal 168 generating output signal A1 which is detected by the second detector 166. Simultaneously, signals A2, and A3 are generated and detected by CCD detector 166. In this mode of operation, the device shown in FIG. 16 functions as a serial to parallel converter. The serial input stream of the data signal 168 is converted into a parallel group of data-bits A1 to A3. Of course, the device could be configured to have more ports to perform a serial to parallel shift of a greater number of bits simultaneously. Alternatively, the three optical signals may be selectively triggered so that only certain predetermined bits of the serial stream will be mixed within the device 160 and thus transmitted and detected by the detector. This option of selective triggering and mixing may be advantageous in many space and time-switching telecommunications applications. In another mode of operation an output signal of the tunable active laser 160 may mix with serial data signal 168 so that sum frequency output pulses B1, B2, and B3 are detected by CCD detector 164. Of course this mode and the latter described mode may be performed simultaneously so that the serial stream of input bits is being detected simultaneously by both of the detectors 164 and 166. Various other schemes of implementation may be envisaged. For example the controllable laser may be operated at various frequencies; furthermore, the controllable laser may be transmitted and as a pulsed signal or a continuous signal.

Numerous other embodiments may be envisaged without departing from the spirit and scope of the invention.

What we claim is:

1. A monolithic integrated circuit for generating an output optical signal in any of a plurality of directions in space comprising:
    controllable coherent light injection means for generating a coherent signal, the frequency of the coherent signal being adjustable in dependence upon the magnitude of a controlling parameter; and
    non-linear waveguide means for generating the output optical signal in response to an other optical signal and to the coherent signal contra-propagating within the waveguide, the direction of the output optical signal being dependent upon the frequency difference between the coherent signal and the other optical signal.

2. A monolithic integrated circuit as defined in claim 1 wherein the other optical signal is generated by lasing means within the integrated circuit.

3. A monolithic integrated circuit as defined in claim 2 wherein the other optical signal is selected from one of a plurality of optical signals generated within the monolithic integrated circuit by the lasing means.

4. A monolithic integrated circuit as defined in claim 1 wherein the other optical signal is an externally generated input optical signal.

5. A monolithic integrated circuit as defined in claim 3 wherein the frequency of the optical output signal is equal to the sum of the frequency of the coherent signal and the frequency of the other optical signal, and wherein the direction of the output signal is related to the difference in wave vectors between the coherent signal and the other optical signal.

6. A monolithic integrated circuit as defined in claim 4 wherein the frequency of the optical output signal is equal to the sum of the frequency of the coherent signal and the frequency of the other optical signal, and wherein the direction of the output signal is related to the difference in wave vectors between the coherent signal and the other optical signal.

7. A monolithic integrated circuit as defined in claim 5 wherein the controlling parameter is one of electrical current, voltage, light, and temperature.

8. A monolithic integrated circuit as defined in claim 1 wherein the controllable light injection means comprises a tunable quantum-well laser.

9. A monolithic integrated circuit comprising:
    a multilayer waveguide wherein each adjacent layer of the multilayer waveguide has different linear and non-linear optical properties; and
    a separate confined single quantum well heterostructure embedded in the multilayer waveguide for providing gain of an optical signal.

10. A monolithic integrated circuit as defined in claim 9 wherein the single quantum well heterostructure includes a cavity for lasing the optical signal.

11. A monolithic integrated circuit as defined in claim 10 wherein the cavity includes distributed feedback means.

12. A monolithic integrated circuit as defined in claim 11 wherein the distributed feedback means comprises surface gratings.

13. A monolithic integrated circuit as defined in claim 10 wherein the frequency of the optical signal is adjustable in dependence upon the magnitude of a controlling parameter.

14. A monolithic integrated waveguide as defined in claim 11 including a first terminal for controlling gain of the optical signal and a second terminal for controlling the frequency of the optical signal.

15. A spatially addressable coherent detection system comprising:
    controllable coherent light injection means for generating a coherent signal, the frequency of the coherent signal being adjustable in dependence upon the magnitude of a controlling parameter; and, non-linear waveguide means for generating an output optical signal in response to an other optical signal and to the coherent signal contra-propagating and mixing within the waveguide, the direction of the output optical signal being dependent upon the frequency difference between the coherent signal and the other optical signal; and, means for detecting the output optical signal.

16. A system as defined in claim 15 wherein the controllable light injection means is integrated into a monolithic integrated circuit.

17. A system as defined in claim 16 wherein the means for detecting the optical signal comprises an array of n detectors, where n is a predetermined number.

18. A system as defined in claim 16 wherein the means for detecting the optical signal is integrated into the monolithic circuit.

19. In a non-linear waveguide having an integrated tunable laser for generating a coherent light signal, a method of propagating an optical signal in a plurality of directions in space comprising the steps of:

a) directing an other contra-propagating optical signal into a non-linear waveguide means for generating an output optical signal, the direction of the output optical signal being determined by the frequency difference between the coherent light-signal and the other optical signal; and, b) varying the frequency coherent light-signal.

20. A spacially addressable coherent detection system as defined in claim 16 further comprising a holographic medium for reflecting the output signal from the non linear waveguide means encoded with information stored on the holographic medium to the means for detecting the output signal.

* * * * *